(12) United States Patent
Markle

(10) Patent No.: US 6,809,888 B1
(45) Date of Patent: Oct. 26, 2004

(54) APPARATUS AND METHODS FOR THERMAL REDUCTION OF OPTICAL DISTORTION

(75) Inventor: David A. Markle, Saratoga, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 10/418,591

(22) Filed: Apr. 16, 2003

(51) Int. Cl.⁷ .......................... G02B 17/00; G02B 7/18; G03B 27/68
(52) U.S. Cl. .......................... 359/726; 359/820; 355/52
(58) Field of Search .................................. 359/726–736, 359/820; 355/52

(56) References Cited

U.S. PATENT DOCUMENTS

| | | | |
|---|---|---|---|
| 4,391,494 A | 7/1983 | Hershel | 350/442 |
| 4,676,631 A | 6/1987 | Kosugi et al. | 355/55 |
| 4,773,748 A | 9/1988 | Shih et al. | 350/611 |
| 6,522,386 B1 * | 2/2003 | Nishi | 3555/52 |
| 6,560,000 B2 * | 5/2003 | Iyer et al. | 359/238 |
| RE38,320 E * | 11/2003 | Nishi et al. | 355/67 |
| 2002/0154421 A1 * | 10/2002 | Willden | 359/838 |
| 2003/0235682 A1 * | 12/2003 | Sogard | 428/195.1 |

* cited by examiner

Primary Examiner—Georgia Epps
Assistant Examiner—Deborah Raizen
(74) Attorney, Agent, or Firm—Allston L. Jones

(57) ABSTRACT

Apparatus and methods for reducing optical distortion in an optical system by thermal means are disclosed. The apparatus includes a heating/cooling system spaced apart from and in thermal communication with an internally reflecting surface of a refractive element in the optical system. The heating/cooling system is adapted to create a select temperature distribution in the refractive optical element near the internally reflecting surface to alter the refractive index and/or the surface profile in a manner that reduces residual distortion.

12 Claims, 9 Drawing Sheets

Example of lens distortion corresponding to a linear magnification error

Example of lens temperature distribution corresponding to a correction for a linear magnification error

APPARATUS AND METHODS FOR THERMAL REDUCTION OF OPTICAL DISTORTION

BACKGROUND OF THE INVENTION

1. Field of the Invention

The invention relates to optical systems, and in particular it relates to apparatus and methods for reducing optical distortion in optical systems using thermal means.

2. Description of the Prior Art

Essentially all optical systems have imaging imperfections referred to in the art as "aberrations". There are an infinite number of possible aberrations, each varying in a different way with the field position and aperture size of the optical system. Generally it is the low order aberrations that prevail. Depending on the type of optical system, some aberrations are more prevalent than others. Examples of types of aberrations are spherical aberration, coma, astigmatism, field curvature, and distortion. Aberrations can arise for a number of reasons. For example, certain aberrations are inherent in the optical design, which typically assumes perfectly made and positioned optical elements. Other aberrations arise as a result of imperfections in the manufacturing and assembly of the optical system. For example, deviations in the surface curvature, variations in the surface shape (e.g., undulations, grooves, etc.), variations in refractive index, and variations in the spacing, centering and tilt from the ideal design are all potential sources of aberrations.

By virtue of the optical design, the aberrations in the system will have different sensitivities to certain departures from perfection—i.e., some departures from perfection on some elements contribute more to certain aberrations than other departures. Accordingly, different fabrication and alignment tolerances are placed on different elements.

In many optical systems, distortion is particularly problematic. Distortion is defined as the variation of an image point location from its ideal location as a function of field position. Included in the definition of distortion is magnification error, which is a linear change in the position of points in the image with the distance from the center of the field.

Distortion cannot be corrected at the pupil because each point in the field shares the pupil and any correction at the pupil would produce the same effect over the entire field.

By way of example, in a folded projection optical system, out-of-plane deviations in a folding surface located between the focal planes and the pupil can cause distortion in the image. Distortion arising from the folding surface imperfections can be static, such as those caused by surface figuring errors, or dynamic such those caused by warping of the folding surface by thermal transients. While great pains can be taken to minimize distortion in the optical design, in practice it is very difficult to reduce distortion to tolerable amounts due to fabrication and assembly errors, as well as from environmental effects.

For example, controlling distortion in optical lithography lenses is of extreme importance because different lithography systems are used to image different layers, and small image placement errors ultimately result in the circuit feature produced by one layer failing to connect properly with that of another layer.

An example optical lithography lens system is the Wynne-Dyson system, such as described in U.S. Pat. No. 4,391,494 (hereinafter, "the '494 patent"), which patent is incorporated herein by reference. The Wynne-Dyson system is a symmetric system having two folding surfaces located close to and equidistant from the object and image planes. Theoretically this design has no distortion of any order because of its symmetrical nature. In practice the folding surfaces, which are internal reflecting surfaces of respective prisms, are the major contributors to image distortion. If the imperfections of the folding surfaces could be made identical then the distortion contributions from the two prisms would be equal and opposite and would cancel. However, in practice figure matching is never perfect and the residual errors contribute substantially to the total distortion observed in the image.

Other sources of distortion include refractive index inhomogeneities in the glasses used in the prisms and the refractive lenses as well as the surface figures of the other refractive components. In practice, distortions as large as 100 nm are possible. The main reason the prism hypotenuse surfaces produce most of the image distortion is because they act as a internally reflecting surface that produces an effect on the reflected wavefront equal to double the index of refraction multiplied by the prism surface imperfection.

One approach used to correct residual amounts of aberrations in optical systems is through the use of adaptive optics. US Pat. No. 4,773,748 to Shih et al. discloses a deformable mirror system for reducing distortion in a projected image. However, this system relies on using a mirror made up of two sheets of material having different coefficients of expansion and an array of electrical resistors to heat the mirror to physically distort the reflective surface. Such a system is not amenable or adaptable for use in certain types of optical systems such as the Wynne-Dyson system because there is no suitable location in the system for such a mirror. Further, there can be no physical contact with the internally reflecting surface of the Wynne-Dyson prism because such contact adversely affects the internal reflection properties of the prism.

While totally eliminating residual distortion from an optical system is probably an impractical pursuit, many optical systems—and particularly optical lithography systems with refractive elements—would greatly benefit from apparatus and methods that result in significant reductions in distortion.

SUMMARY OF THE INVENTION

A first aspect of the invention is an apparatus for reducing residual distortion in an optical system. The optical system in question has a refractive optical element, such as a prism, having an internally reflecting surface, a surface profile and a refractive index. The apparatus includes a heating/cooling system spaced apart from but in thermal communication with the internally reflecting surface. The heating/cooling system is adapted to create a select temperature distribution in the refractive optical element near the internally reflecting surface to alter the refractive index and/or the surface profile in a manner that reduces the residual distortion.

A second aspect of the invention is a method of reducing distortion in the aforementioned optical system. The method includes arranging a heating/cooling system spaced apart from but in thermal communication with the internally reflecting surface, and then using the heating system to create a select temperature distribution in the refractive optical element near the internally reflecting surface to alter the refractive index and/or the surface profile to reduce residual distortion.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Example Optical System

Figure 1A:
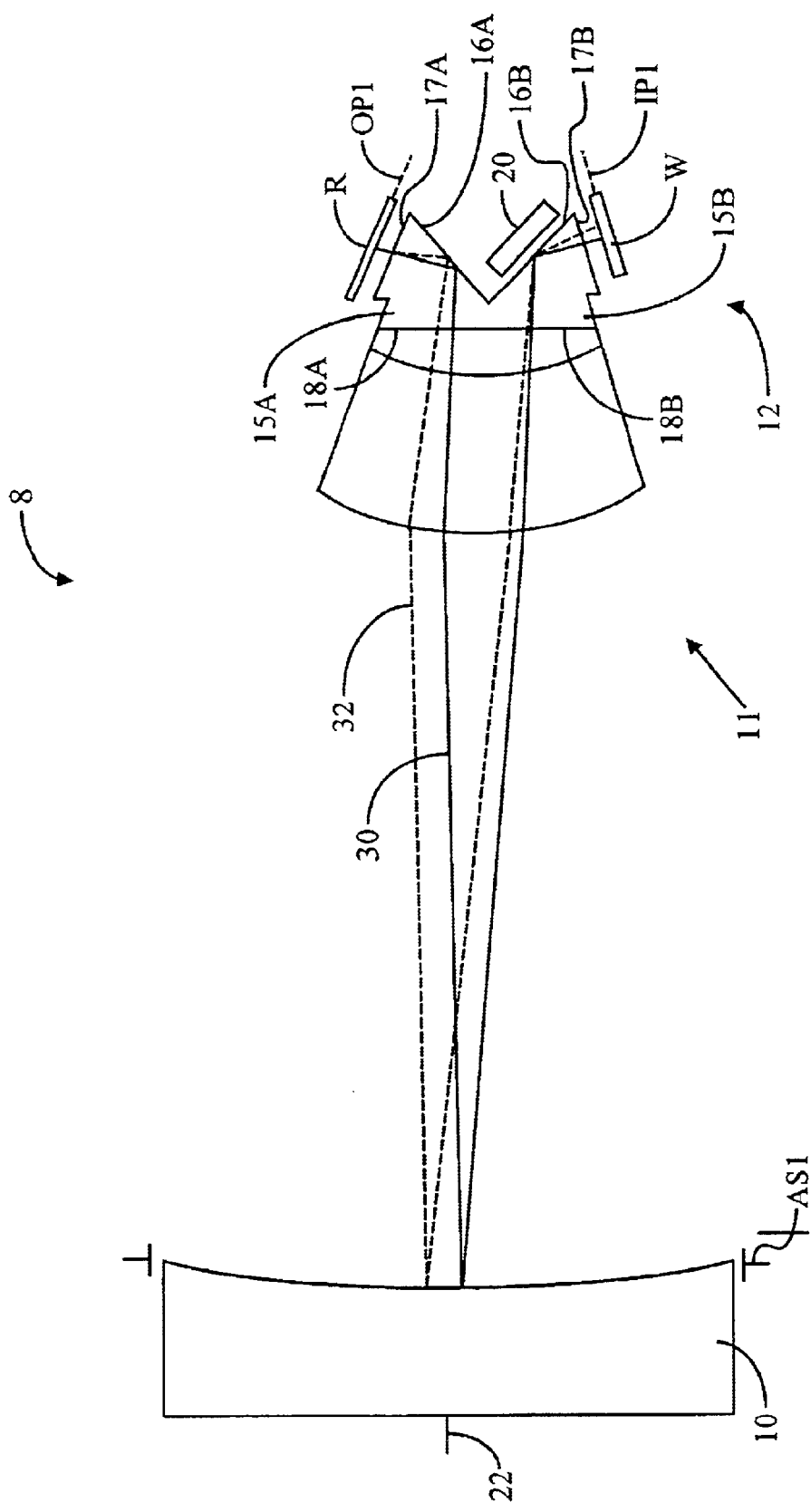
FIG. 1A is a cross-sectional diagram of a Wynne-Dyson optical system.

With reference to FIG. 1A, there is shown a cross-sectional diagram of a Wynne-Dyson optical system 8. Optical system 8 is a unit-magnification, catadioptric, achromatic and anastigmatic, optical projection system that uses both reflective and refractive elements in a complementary fashion to achieve large field sizes and high numerical apertures. The system is essentially symmetrical relative to an aperture stop located at the mirror, which in theory eliminates odd order aberrations such as coma, distortion and lateral color. All of the spherical surfaces are nearly concentric, with the centers of curvature located close to where the focal plane would be located were the system not folded. Because almost all of the optical power in the system is in the reflective primary mirror, the resultant system focal plane position is independent of the index of refraction of the air in the lens, making pressure compensation unnecessary.

Optical system 8 includes a concave spherical mirror 10, an aperture stop AS1 located at the mirror, a refractive lens group 11, and a prism assembly 12. Prism assembly 12 includes symmetric fold prisms 15A and 15B having respective internal reflecting surfaces 16A and 16B. Prism 15A also has a reticle-wise surface 17A and a mirror-wise surface 18A. Likewise, prism 15B has wafer-wise surface 17B and mirror-wise surface 18B. Symmetric fold prisms 15A and 15B are used to attain sufficient working space for movement of a reticle R held in an object plane OP1, and a wafer W held in an image plane IP1. Arranged adjacent prism assembly 12 and in thermal communication with surface 16B is a heating/cooling system 20, discussed in greater detail below.

Mirror 10, lens group 11 and prism assembly 12 are disposed symmetrically about an optical axis 22. Optical system 8 is essentially symmetrical relative to aperture stop AS1 located at mirror 10 so that the system is initially corrected for coma, distortion, and lateral color.

In optical system 8, refractive lens group 11 and prism assembly 12, in conjunction with mirror 10, in theory correct the remaining optical aberrations, which include axial color, astigmatism, Petzval or field curvature, and spherical aberration.

In optical system 8, an ideal ray 30 (solid line) originates from a point on reticle R, enters prism 15A at surface 17A, internally reflects within prism 15A at surface 16A, and exits prism surface 18A. Ray 30 continues through the upper portion of refractive lens group 11, reflects from mirror 10, passes back through the lower portion the refractive lens group 11, enters prism 15B at surface 18B, internally reflects within the prism at surface 16B, exits the prism at surface 17B, and reaches wafer W.

In theory the position of ideal ray 30 on wafer W should be the exact symmetrical opposite position as its origin point on reticle R. In practice, however, imperfections in the optical system cause ray 30 to deviate from an ideal path. The actual ray path is indicated by ray 32 (dashed line). In practice, upon entering prism 15A at surface 17A, small variations in the refractive index and the flatness of surface 16A cause ray 32 to deviate from the ideal path represented by ideal ray 30. Ray 32 internally reflects from side 16A, and then passes through the remaining portion of prism 15A. Again, after returning to bottom prism 15B, variations in the refractive index of the prism and the flatness of surface of surface 17A cause ray 32 to deviate even more from the path of ideal ray 30 as is travels between side 16B and surface 17B.

Figure 1B:
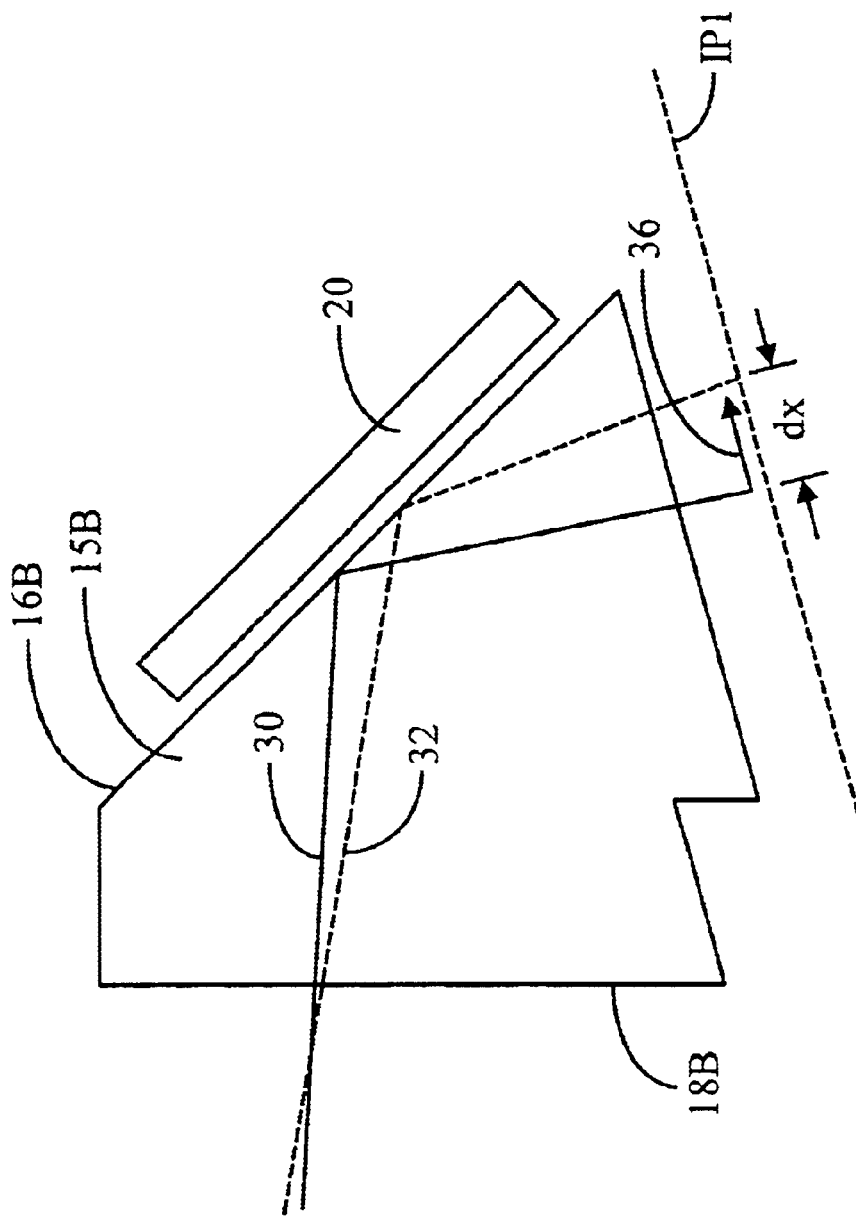
FIG. 1B is a detailed close-up schematic diagram of the image plane and the adjacent prism (prism 15B) of the prism assembly of the optical system of FIG. 1, illustrating the measurement of distortion (dx)

FIG. 1B is a detailed closeup schematic diagram of image plane IP1 and prism 15B of the prism assembly 12 of the optical system of FIG. 1. The difference in position dx between ideal ray 30 and actual ray 32 at image plane IP1 is a measure of the distortion. A vector 36 (referred to also as a "image placement error vector") is used to denote the magnitude and direction of the distortion.

Generalized Heating System Embodiment

Figure 2:
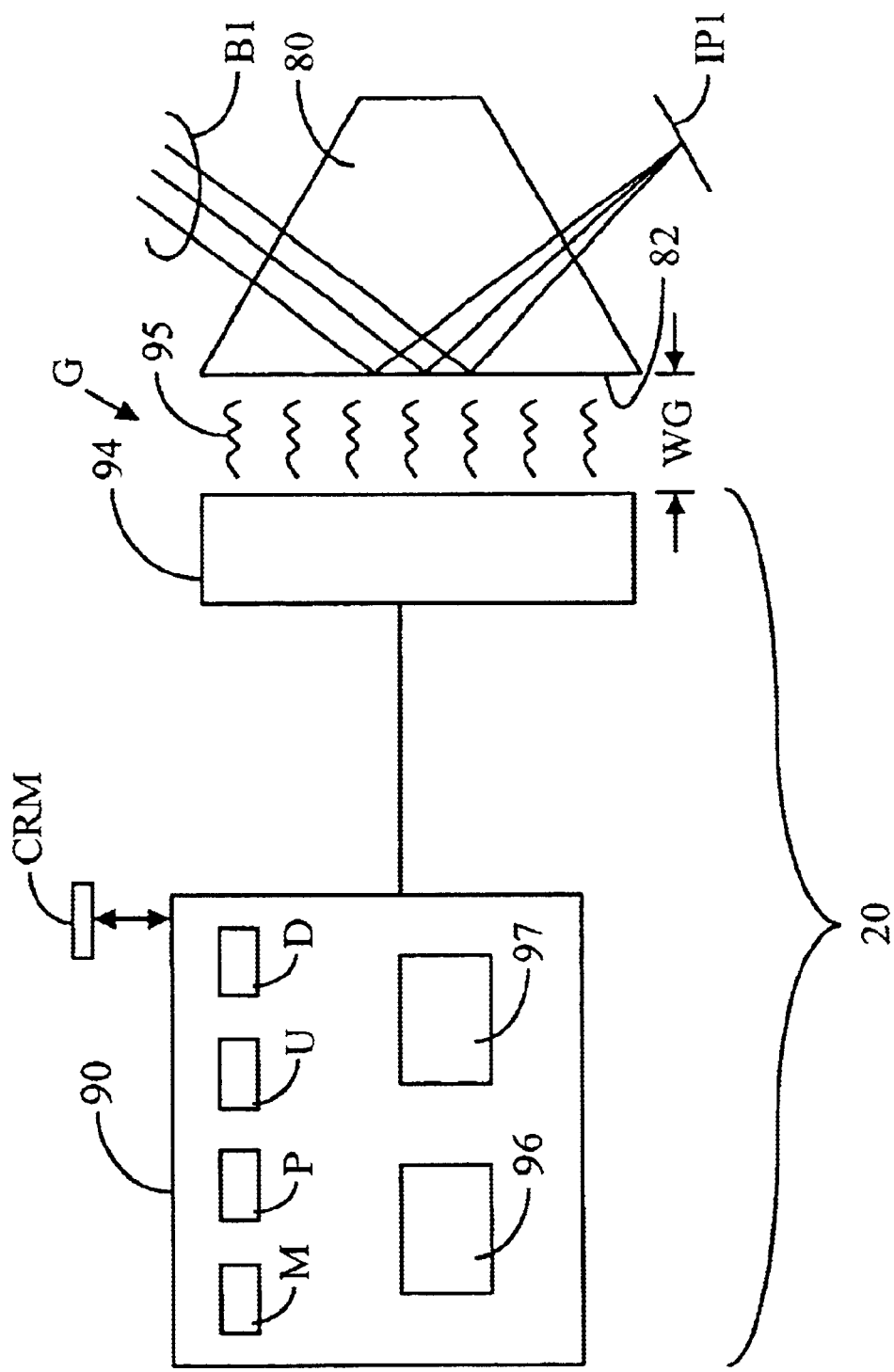
FIG. 2 is a schematic diagram of a generalized heating/cooling system of the present invention as arranged adjacent a refractive element having an internally reflecting surface.

FIG. 2 is a schematic diagram of a generalized heating/cooling system 20 of the present invention. Heating/cooling system 20 is capable of providing a spatially varying heat distribution to surface 16B of prism 15B (FIG. 1). System 20 is used to perform distortion reduction by introducing temperature non-uniformities (i.e., a spatially varying temperature distribution) in a refractive optical element 80. Element 80 is made of an optically refractive material (e.g., glass) and has an internally reflective surface 82 (e.g., surface 16B of prism 15B). Refractive optical element 80 is part of a greater optical system (not shown). For example, optical element 80 is prism 15B of optical system 8. An internally reflecting ray bundle B1 associated with the greater optical system is shown converging onto the system's image plane IP1.

In a general embodiment, heating/cooling system includes a controller 90 coupled to a heating/cooling unit 94. Heating/cooling unit 94 is in thermal communication with optical element 80, as indicated by heat transfer 95. Heating/cooling unit 94 is separated from surface 82 of optical element 80 by a gap G having a width WG. The main mechanism for heat transfer 95 is thermal conduction across the very small (e.g. 2-micron) gap G between the heating/cooling unit and the prism face.

Controller 90 provides control signals to heating/cooling unit 94 to cause the heating/cooling unit to deliver/extract heat across gap G to/from surface 82 in a manner that forms a select temperature distribution within optical element 80. The select temperature distribution results in a corresponding select refractive index distribution (variation) and a select surface warp being formed in the material and surface of optical element 80. The select refractive index distribution and warped surface profile act to reduce residual distortion, as described in greater detail below.

In an example embodiment, controller 90 is a computer system that includes a memory unit M, a processor P, a data storage unit U such as a hard disk drive, a programmable current supply 96, and a multiplexer 97, all interconnected. Controller 90 is programmable, such as by inputting instructions recorded on a computer-readable medium CRM (e.g., a floppy disk or a compact disk) into drive D and storing the instructions on data storage unit U. Controller 90 is also adapted to receive (e.g., via CRM) and process (e.g., via processor P) data relating to distortion measurements performed on optical system 8.

Gap G allows heating/cooling unit 94 to be in thermal communication with surface 82 without physically touching the surface. Gap G needs to be large enough so that heating/cooling unit 94 does not significantly affect the internal reflectivity of the surface. In an example embodiment, gap width WG is as small as about 2 microns. Also, because the amounts of heat involved are small as discussed in greater detail below, in an example embodiment heating/cooling unit 94 may provide bursts of heat to different areas of surface 82 in a rapid sequential order rather than to the entire surface simultaneously. This reduces the number of interconnections needed between the heating/cooling unit and the controller, which simplifies the system and reduces cost.

Heating/cooling unit 94 can have any one of a number of different configurations. An example embodiment of a preferred configuration is discussed immediately below.

Example Heating/cooling Unit

Figure 3A:
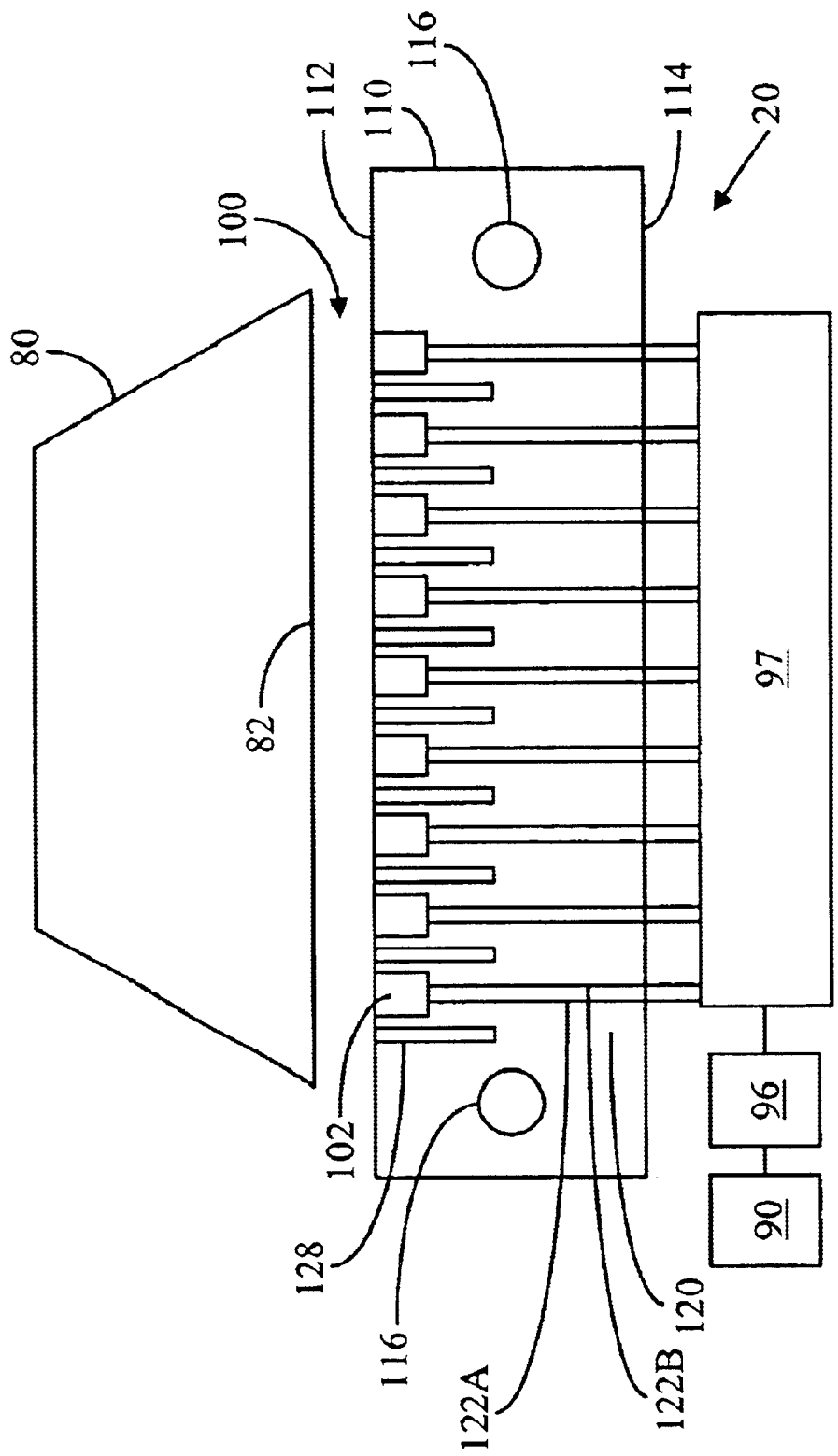
FIG. 3A is a schematic diagram of an example embodiment of a heating system having a heating unit that includes an array of heating/cooling probes.

FIG. 3A is a schematic diagram of an example embodiment of heating system 20 shown arranged adjacent refractive optical element 80, wherein heating/cooling unit 94 that includes a plurality (e.g., an array) 100 of resistive heating/cooling elements or "probes" 102 supported in a thermally controlled support plate 110 with an upper surface 112 and a lower surface 114. Support plate 110 is arranged such that it places probes 102 in thermal communication with surface 82 of refractive optical element 80. Support plate 110 includes cooling channels 116 that allow the plate to be maintained at a select temperature by flowing a cooling fluid through the channels. Probes 102 are connected to multiplexer 97 via leads 122A and 122B. Leads 122A are connected to ground through multiplexer 97, and leads 122B are connected to the programmable current supply via the multiplexer.

In an example embodiment, thermal control plate 110 includes slots 128 formed in upper surface 112 of the thermal control plate and surrounding each probe 102. Slots 128 serve as heat transfer barriers so that the temperature of the end of each probe near the surface 112 is not substantially influenced by the temperatures of adjacent probes. In an example embodiment, the center-to-center spacing of probes 102 is between 4 mm and 10 mm.

Figure 3B:
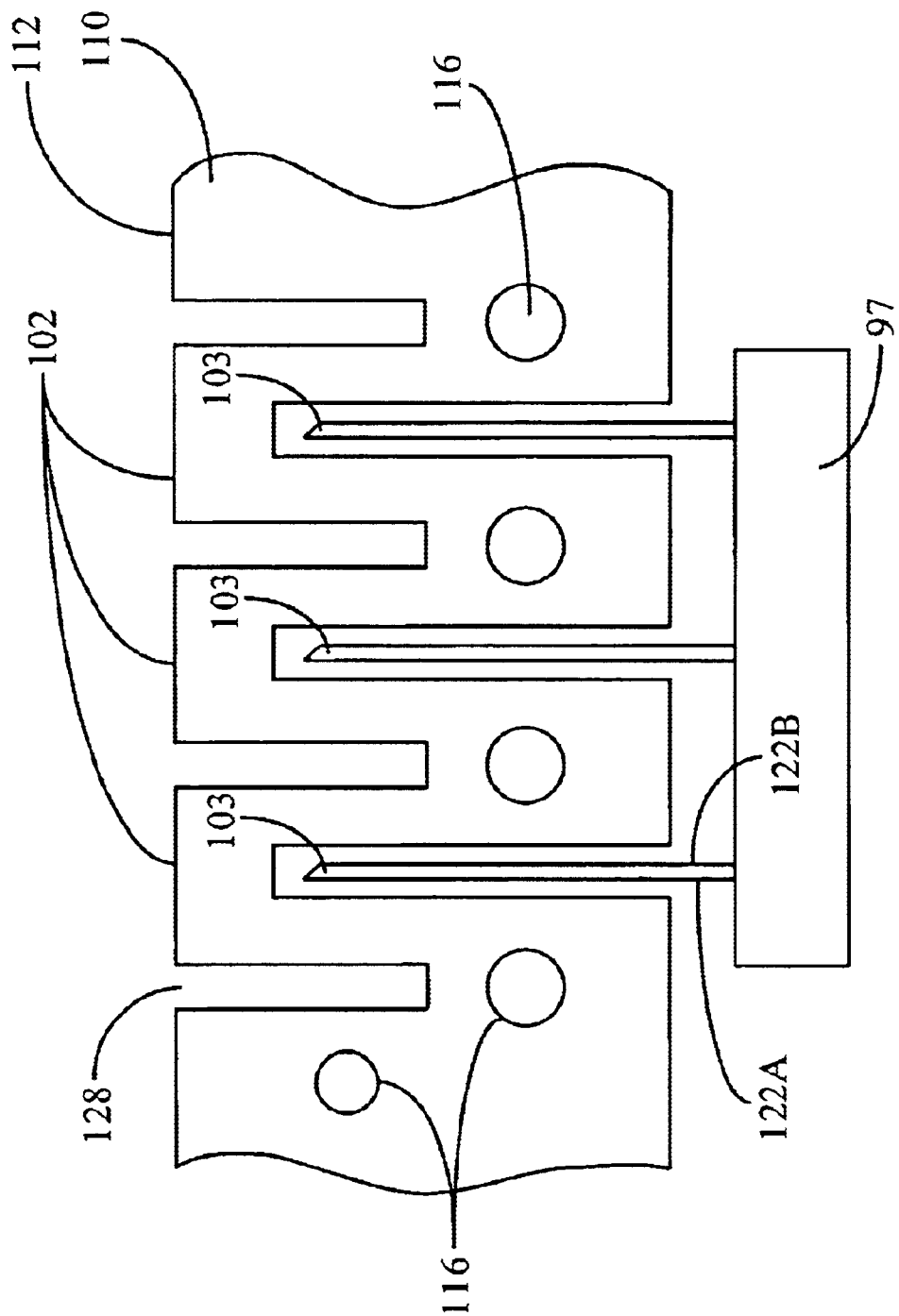
FIG. 3B is a close-up view of an example embodiment of the array of heating/cooling probes of FIG. 3A wherein the probes include resistors.

FIG. 3B is a close-up cross-sectional view of an example embodiment of support plate 110 and probes 102. In FIG. 3B, support plate 110 includes a two dimensional array of grooves 128 that divide the plate into the plurality of probes 102. In an example embodiment, grooves 128 are 1 mm wide and spaced 6 mm apart so that each probe 102 is a column (e.g., 5 by 5 mm square) that contains a small resistor 103 arranged therein a short distance (e.g., about 3 mm) from plate upper surface 112. Leads 122A and 122B are thus connected to resistor 103 and couple each resistor to ground and to current supply 96 through multiplexer 97 as described above in connection with FIG. 3A.

If support plate 110 is cooled via coolant flow through cooling channels 116, and no current is applied to resistors 103, then the probe acquires the temperature of the coolant, which is below ambient. In this way, probes 102 can act to selectively cool portions of surface 82. If current is applied to resistors 103, then the temperature along the length of the probe varies from the coolant temperature at the base to the temperature maintained at the probe tip. In this way, probes 102 can act to selective heat portions of surface 82. In an example embodiment, the cooled support plate 110 is maintained at 1° C. below the ambient temperature and the probes are heated to as much as 1° C. above the ambient temperature.

In one example embodiment, resistors 103 are each encapsulated in a material (e.g., a potting compound) that is an electrical insulator but a reasonably good thermal conductor to thermally couple the heating element to support plate 110 and minimizes the loss of heat through leads 122A and 122B.

With reference to either of FIG. 3A or 3B, when current is supplied to probes 102 from current supply 96, the regions of support plate 110 around each probe become heated. On the other hand, if little or no power is applied, then the area around heating elements 102 approaches the temperature of surrounding base plate 110. In an example embodiment, thermal control plate 110 is maintained below ambient temperature with a cooling fluid (e.g., water) flowing through channels 116 formed in the thermal control plate.

In example embodiments, support plate 110 is made of either INVAR or a low coefficient of expansion glass/ceramic such as ZERODUR from Schott, ULE from Corning or CLEARCERAM-Z from Ohara. Each of these materials has a relatively low coefficient of expansion so that the shape of the plate is not appreciably deformed by small temperature gradients. This property assists in maintaining a small, uniform air gap G between thermally controlled support plate 110 and refractive element 80.

Example Resistive Element Array

Figure 4:
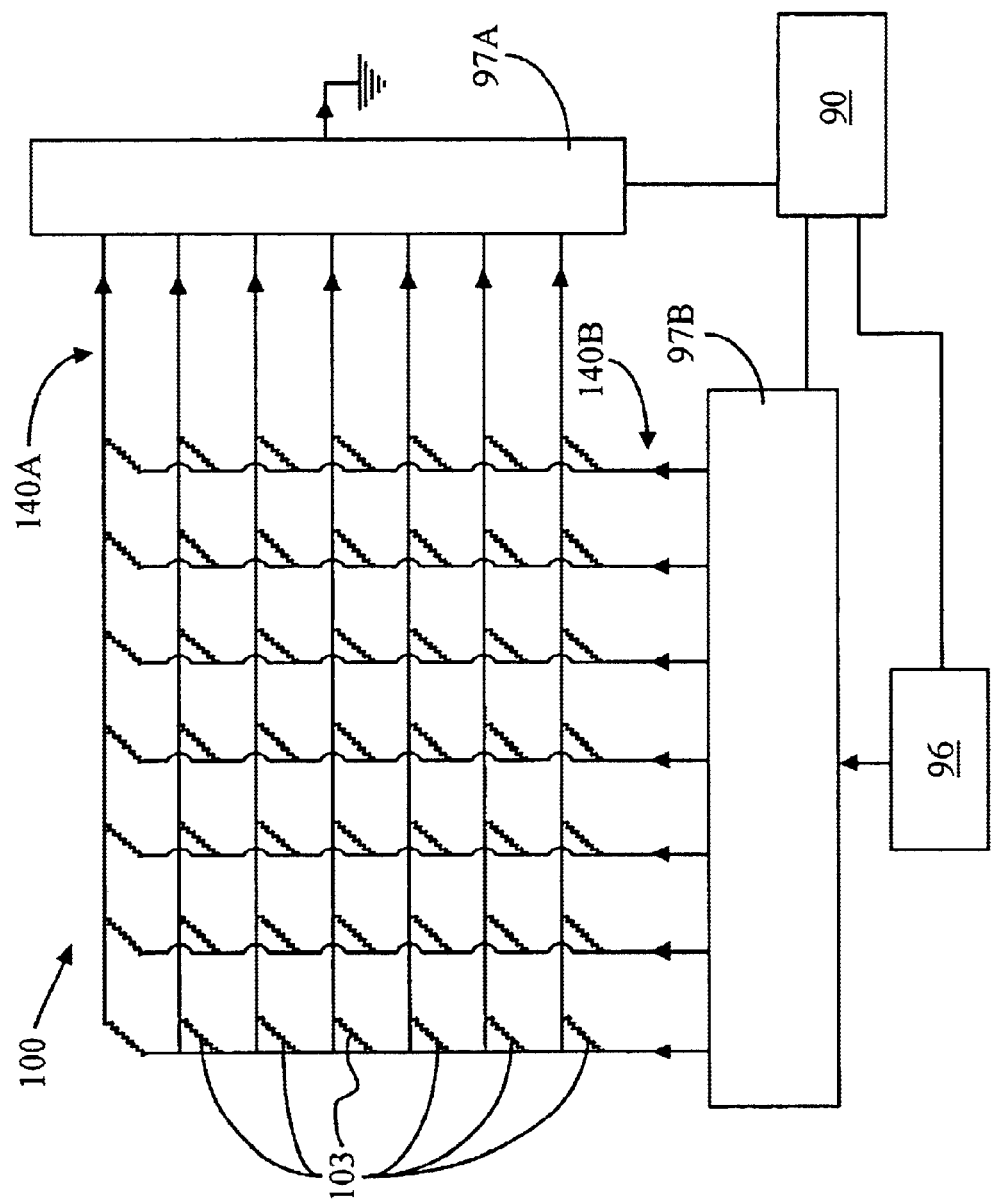
FIG. 4 is a schematic diagram of a heating system having a heating unit with a two-dimensional array of individually addressable resistive heating elements.

FIG. 4 is a schematic diagram of an example embodiment of array 100 formed as a two-dimensional array of individually addressable resistors 103. The leads of any resistor in the array 100 can be connected through respective multiplexers 97A and 97B to ground and to programmable current supply 96. Controller 90, power supply 96 and multiplexers 97A and 97B are operable to supply a multiplexed current to the array, i.e., to supply a current to each resistor 103 in a rapid sequence.

Controller 90 controls the operation of multiplexers 97A and 97B, and programmable power supply 96. In an example embodiment, the current provided to each resistor 103 by current supply 96 is pre-computed by an algorithm that uses the measured image distortion as an input. In an example embodiment, an iterative approach is used to perfect the correction whereby the residual distortion resulting after one correction cycle is corrected by a refined estimate to compensate for residual distortion errors. In an example embodiment, the algorithm also handles imperfections in the operation of the hardware, etc.

Method of Operation

As discussed above, even though optical system 8 (FIG. 1) has theoretically perfect correction of distortion, in practice distortion arises due to imperfections in the fabrication and placement of the optical elements. In optical system 8, a main contributor to distortion is deviations from flatness on internally reflecting surfaces 16A and 16B of prism assembly 12. An imperfection such as a small bump of height δ in such an internally reflecting surface creates a corresponding error ΔP in the incident wavefront given by:

$$\Delta P = 2\delta n \cos\theta \tag{EQ. 1}$$

where:

n is the index of refraction of the glass;

δ is the bump height; and

θ is the angle of incidence on the reflecting surface.

In a typical example where the refractive index is 1.6 and the angle of incidence is 60°, the effect of a bump is magnified by 1.6 times Prisms 15A and 15B typically have fixed (static) amounts of refractive index variations and surface shape variations. Further, temperature changes in the prisms resulting from the beginning of an exposure cycle of a batch of wafers create time-varying (dynamic) changes in distortion. One of the advantages of having controller 90 is that the temperature distribution can be quickly changed so that it follows and corrects for both the static and the dynamic changes in distortion. In an example embodiment, controller 90 is coupled to the optical system controller (not shown). In this case, controller 90 knows how much light has flowed through system 8, how much light has been absorbed at the mask and for how long. From this data it can accurately estimated how much heat to apply to prism 15B to achieve dynamic correction of distortion.

Figure 5:
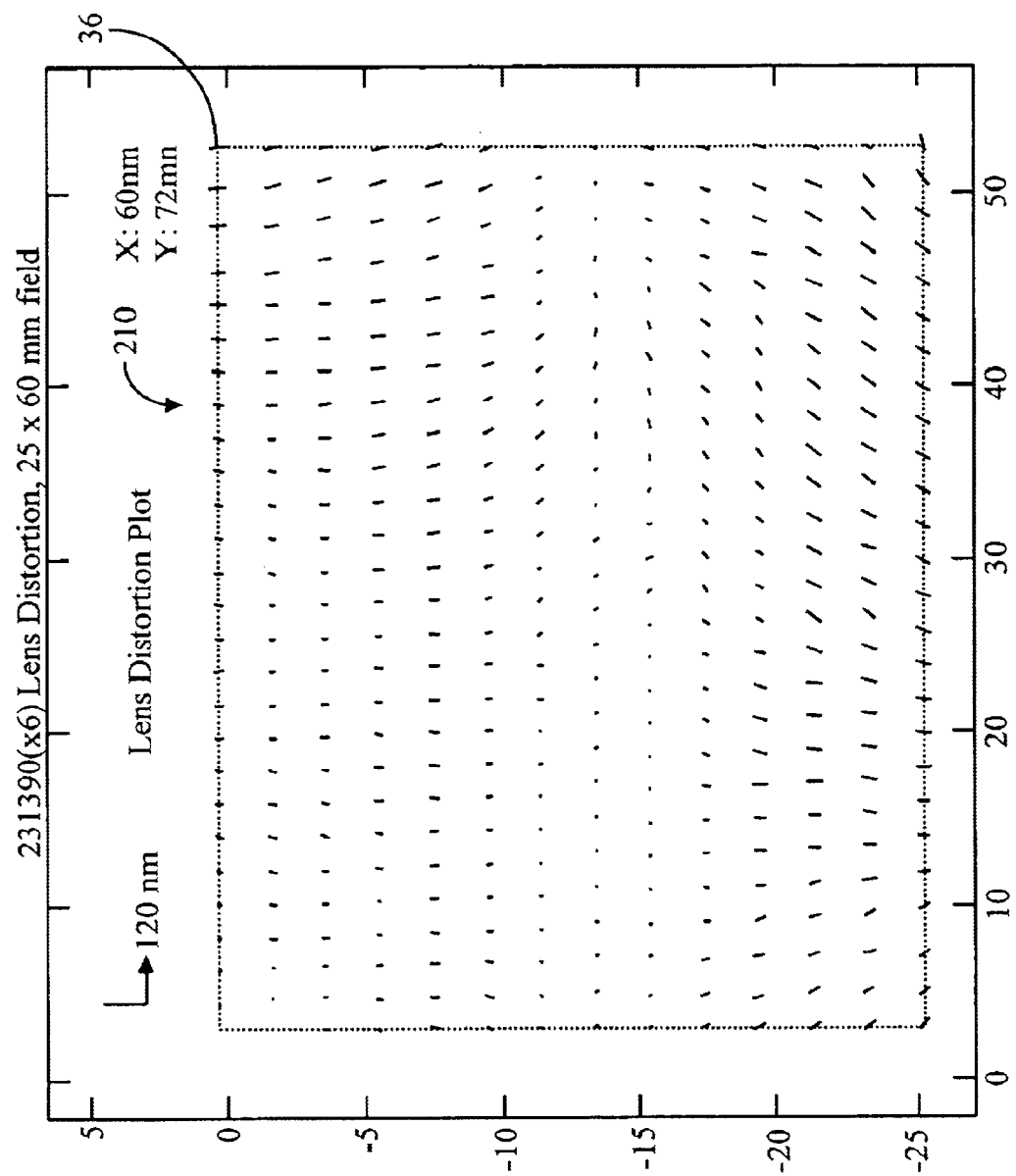
FIG. 5 is a vector diagram of an example residual distortion field for an optical system such as the optical system of FIG. 1A.

FIG. 5 is an actual plot of image placement error vectors 36 that make up an example residual distortion field 210 for an example optical system 8 (FIG. 1) having a 26 mm×50 mm image field. Distortion fields 210 are obtained in practice by exposing a special measurement reticle on several fields on a wafer coated with a photosensitive medium (e.g., photoresist). The special measurement reticle typically has a regularly spaced pattern of fiducial marks, whose positions have been precisely measured. The exposed wafer images are developed using standard techniques and the imaged pattern locations are measured, averaged and compared (mapped) to their measured locations on the reticle.

Typically, the residual distortion of system 8 has a distortion field 210 that varies in a smooth and continuous manner i.e., a few cycles over the field, such as illustrated in FIG. 5. In such instances, it is possible to further reduce the distortion by introducing a select temperature distribution in prism 15B by heating/cooling the prism at side 16B using heating/cooling system 20 as described above.

In an example embodiment, the reduction in distortion is accomplished by heating/cooling prism 15A at side 16A or prism 15B at side 16B. In another example embodiment, the reduction in distortion is accomplished by heating/cooling both prisms 15A and 15B at respective sides 16A and 16B. The discussion below assumes distortion is corrected by heating prism 15B only; however, the discussion applies equally to heating prism 15A or heating both prisms 15A and 15B.

The temperature distribution imparted to prism 15B is selected to produce, to the extent possible, a refractive index change in the prism, and a surface profile change of the reflective surface that results in an image distortion equal and opposite to the residual image distortion.

Figure 6A:
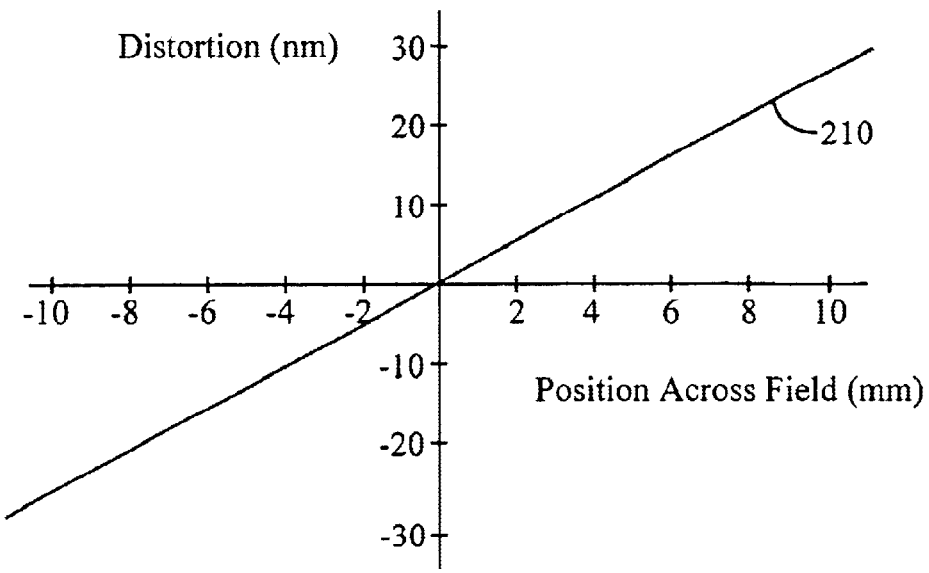
FIG. 6A is a graph showing how distortion varies across the field for a linear magnification error.

FIG. 6A is a plot of field position (mm) vs. distortion (nm) illustrating a commonly occurring distortion field 210 component referred to herein as "magnification error". In a 1X Wynne Dyson optical system such as system 8 of FIG. 1, magnification errors are not easily corrected and might vary depending on the heat transmitted to prism 15A because of the close proximity of reticle R. In some cases reticle R can absorb more than 50% of the incident illumination.

Figure 6B:
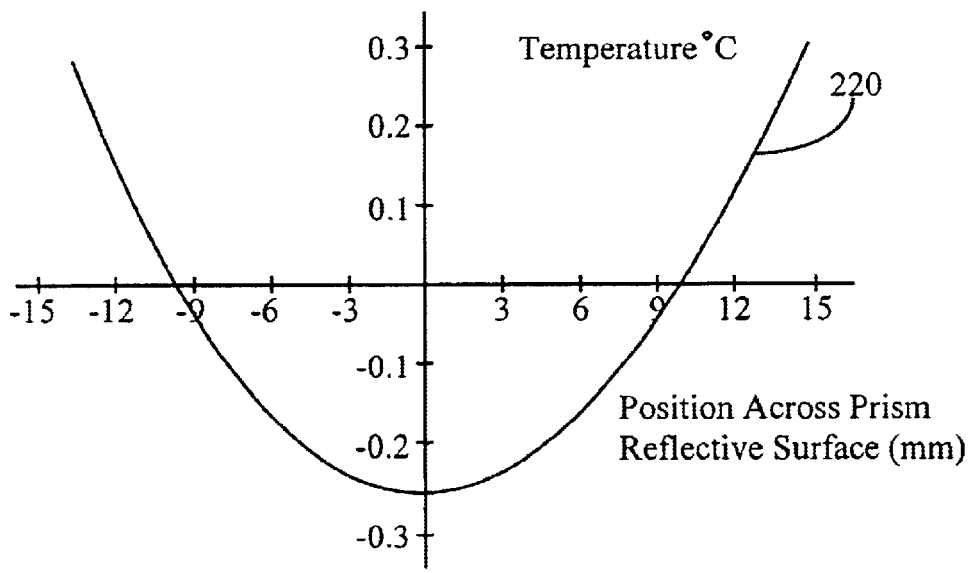
FIG. 6B is a graph showing the temperature distribution across the face of the internal reflection surface of prism 15B of the optical system of FIG. 1A to reduce the linear magnification error of FIG. 6A.

FIG. 6B is a plot of an example temperature distribution field (° C.) vs. prism surface location (mm) that generally compensates or otherwise reduces the distortion in distortion field 210 of FIG. 6A. Application of the temperature distribution 220 of FIG. 6B onto the internally reflecting surfaces 16A and/or 16B of folding prisms 15A and/or 15B creates a refractive index distribution and a surface profile that either acts to cancel or double the residual image distortion shown in FIG. 6A, depending the particular prism heated and the sign conventions used. A temperature distribution applied to prism surface 16A will produce the opposite effect as the same temperature distribution applied to prism surface 16B. Identical temperature distributions running from the contact point of the two prisms outward to the prism tips would tend to cancel out the image distortion thus produced.

Figure 7:
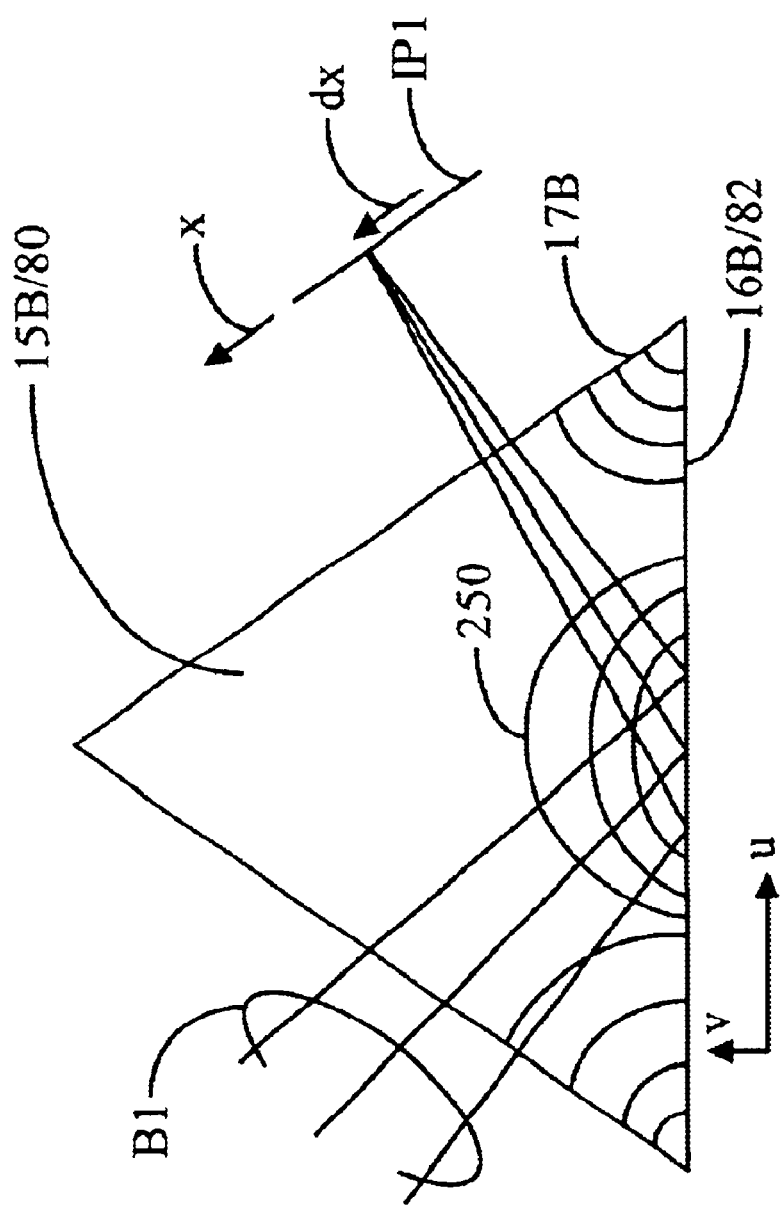
FIG. 7 is a cross-sectional view of prism 15B showing an example of the temperature and refractive-index contours within the prism after the temperature distribution of FIG. 6B is applied to the internally reflecting surface of the prism.

FIG. 7 is a schematic cross-sectional view of prism 15B showing an example of the temperature and refractive index distributions within the prism as formed by applying the quadratic thermal distribution of FIG. 6B using the heating system 20 of FIG. 2 to reduce the residual distortion of the optical system as represented by FIG. 6A. The contour lines 250 represent both constant temperature/refractive index values within refractive element 80. The refractive index variation between each contour 250 is about $0.46 \times 10^{-6}$, and the temperature variation is about 0.1° C.

Estimating the Temperature Distribution

The image position of an image-forming beam B1 at image plate IP1 such as that shown in FIG. 7 is shifted by an amount dx (FIG. 1B) that depends upon the path length change of the rays in the beam on one side of the beam relative to the rays on the other side of the beam. To a first approximation, only the extreme outer rays in the beam need be considered. The change in path ΔP for these two rays is approximated by the following equation:

$$\Delta P = 2L(dT/du)F(u)(na + (dn/dT)) \tag{Eq. 2}$$

where:

L is the effective depth that the effected temperature distribution extends into the refractive element;

n is the index of refraction of the refractive element;

dT/du is the change in temperature per unit length along the refractive reflecting surface at coordinate u;

F(u) is the footprint size of the beam along the reflecting surface at coordinate u, which is a simple linear function of the coordinate of the position where the center of the beam intersects the surface;

a is the coefficient of expansion of the prism material; and dn/dT is the change of index of the prism glass with temperature.

The factor of 2 in Equation (2) comes about because the reflected beam passes twice through the element.

Equation (1) indicates that the cosine of the angle of incidence (cosθ) is also a variable. The path length of the beam through the heated part of the refractive element varies as 1/cosθ and the differential change in path varies as cosθ so these two effects cancel each other in Equation (2).

The change in image position dx (i.e., the distortion) is approximated by the equation:

$$dx = \Delta P / 2NA \tag{Eq. 3}$$

where NA is the numerical aperture of the image-forming beam B1.

Combining equations (2) and (3) and solving for dx yields:

$$dx = L(dT/du)F(u)(an + (dn/dT))/NA \tag{Eq. 4}$$

From equation (4) it is readily seen that the distortion is proportional to the temperature gradient (dT/du) as measured along surface coordinate u. It is also clear from FIG. 7 that the position of the center of the beam on surface 82 (e.g., prism surface 16B) is directly related to its position on the image plane IP1 as measured with coordinate x. Thus the distortion dx can be written as a function g(u). The temperature along surface u can be found by integration:

$$T(u) = (NA/L(na + (dn/dT))\int(g(u)/F(u))du + C \qquad (Eq. 5)$$

By choosing an appropriate constant of integration C, the average temperature of the temperature distribution can be kept near the ambient temperature, as was done in the example in FIG. 6B.

In the above derivation, the correct sign depends on which prism the temperature correction is made, the sign convention used to define distortion, and the image plane coordinate directions.

An accurate estimate of the temperature distribution required to reduce or cancel a given amount of distortion requires the use of finite element models to solve the resultant temperature distribution, and the deformation of the reflective surface. Distortion dx or g(u) is then calculated using a ray trace program capable of handling an inhomogeneous index distribution and a reflecting surface having a warped surface profile. However, Equation (5) provides a rough estimate, which when used iteratively, results in a substantial reduction in distortion.

A shortcoming of correcting distortion using Equation (5) is the effective heat penetration depth L into the prism, which is assumed to be a constant in the equation, but which really depends on the spatial frequency components of the temperature distribution. High spatial frequency components will not extend into the prism as far as low spatial frequency components. Thus, one avenue to further refine the distortion correction technique based on equation (5) is to apply it to different spatial frequency components using a value of L appropriate to each frequency.

Distortion and Element Temperature Sensitivity

As mentioned above, residual distortion in high-performance optical systems such as optical lithography systems is typically quite small (e.g., typically between about 50 to 150 nanometers). Consequently, effectuating a significant change in the residual distortion (i.e., significantly changing the path length of some rays) requires that only small temperature differences be introduced in the refractive element 80 (e.g., prism 15B).

To illustrate this point, consider the change in path length $\Delta P$ for a ray passing through prism 15B and reflecting from surface 16B. $\Delta P$ is given by equation (2) above and repeated here for convenience:

$$\Delta P = 2L(dT/du)F(u)(an + (dn/dT)) \qquad (Eq. 2)$$

By way of example, consider prism 15B to be made of Schott SK-02, an optical glass having an index of refraction n=1.627, a coefficient of thermal expansion $a=6.3 \times 10^{-6}$ per °C. and a change of index with temperature (dn/dT) of $4.5 \times 10^{-6}$ per °C. A temperature gradient of 0.1° C./mm extending over the 10 mm footprint of a 0.32NA beam and into the glass prism for an effective thickness of 6 mm would create a path difference $\Delta P$ of:

$$\Delta P = 2(6 \text{ mm}(0.1° \text{ C./mm})(10 \text{ mm})((1.627)(6.3 \times 10^{-6}/° \text{ C.}) + 4.5 \times 10^{-6}/° \text{ C.}) = 0.177 \text{ }\mu m$$

For an optical system with a numerical aperture NA of 0.35 the image displacement dx is given by equation (3):

$$dx = \Delta P/2NA = (0.177 \text{ microns})/2 \times 0.35 = 0.25 \text{ microns}$$

This is about 2 times larger than what is typically needed, so that the required temperature gradients are likely to be in the 0.05° C./mm range and the peak-to-peak temperature differences are likely to be about 1° C.

Power Requirements

The amount of power required to produce a desired temperature distribution depends upon the area covered and the average temperature gradient desired in the individual probes 102. Assuming that an area 42 mm by 48 mm is covered by a 7×8 element array 100, and that an average 1° C. temperature difference over a 6 mm probe length is required then the total power P required is given by;

$$P = (42 \text{ mm})(48 \text{ mm})(1° \text{ C.}/6 \text{ mm})(10.4 \text{ W/m}° \text{ C.})/(1000 \text{ mm/m}) = 3.5 \text{ Watts}$$

This assumes that the thermal control plate 110 (FIG. 3) is made of INVAR, which has a thermal conductivity of 10.4 W/m° C. In this case, the average power per probe element would be about 0.063 Watts and the maximum power would be about twice this amount, which is quite minimal. Another possibility is the use of a very low coefficient of expansion glass or ceramic such as ZERODUR from Schott, ULE from Corning, or CLEARCERAM-Z from Ohara. These materials have a thermal conductivity of about 1.5 W/m° C., which reduces the total power consumption to about 0.5 W.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An apparatus for reducing residual distortion in an optical system having a refractive optical element with an internally reflecting surface, a surface profile and a refractive index, the apparatus comprising:

a heating/cooling system spaced apart from but in thermal communication with the internally reflecting surface; and wherein the heating/cooling system is adapted to create a select temperature distribution in the refractive optical element near the internally reflecting surface to alter the refractive index and/or the surface profile in a manner that reduces the residual distortion in the optical system.

2. The apparatus of claim 1, wherein the heating/cooling system includes:

a plurality of individually addressable probes each having a temperature; and a controller coupled to the probes, the controller adapted to control the temperature of each probe.

3. The apparatus of claim 2, wherein the probes include resistors mounted in respective portions of a thermally controlled support plate.

4. The apparatus of claim 3, wherein the thermally controlled support plate includes cooling channels adapted to support the flow of a cooling fluid.

5. The apparatus of claim 2, wherein the controller includes a current supply and a multiplexer coupled to the probe resistors for providing a multiplexed current to the heating elements.

6. The apparatus of claim 5, wherein the controller is adapted to receive and process data relating to reducing distortion in the optical system.

7. A method of reducing distortion in an optical system having a refractive optical element with an index of refraction, and an internally reflecting surface with a surface profile, the method comprising:

arranging a heating/cooling system spaced apart from but in thermal communication with the internally reflecting surface; and using the heating/cooling system, creating a select temperature distribution in the refractive optical element near the internally reflecting surface to alter the refractive index and/or the surface profile to reduce residual distortion.

8. The method of claim 7, wherein creating a select temperature distribution includes selectively heating or cooling portions of the internally reflecting surface with a plurality of individually addressable probes in thermal communication with the reflecting surface.

9. The method of claim 8, further including controlling the operation of the probes with a controller coupled to the probes, wherein the controller provides a select current to a resistor embedded in each probe.

10. The method of claim 9, further including operating the controller to control a current source and a multiplexer such that the providing a select current to each probe is multiplexed.

11. The method of claim 8, wherein the individually addressable probes are formed in a thermally controlled support plate and arranged immediately adjacent but not in direct contact with the internally reflecting surface.

12. The method of claim 11, including controlling the amount of heat transmitted to or from the internally reflecting surface by varying the amount of current supplied to the probes.

* * * * *